United States Patent
Matsunaga et al.

(10) Patent No.: US 8,229,710 B2
(45) Date of Patent: *Jul. 24, 2012

(54) METHOD OF ANALYSIS FOR KINETIC PROPERTIES OF GOLF CLUB HEAD AND GOLF CLUB THEREFOR

(75) Inventors: Hideo Matsunaga, Chichibu (JP); Kozue Wada, Chichibu (JP)

(73) Assignee: Bridgestone Sports Co., Ltd., Tokyo (JP)

( * ) Notice: Subject to any disclaimer, the term of this patent is extended or adjusted under 35 U.S.C. 154(b) by 787 days.

This patent is subject to a terminal disclaimer.

(21) Appl. No.: 12/342,112

(22) Filed: Dec. 23, 2008

(65) Prior Publication Data

US 2010/0161294 A1    Jun. 24, 2010

(51) Int. Cl.
*G06F 17/50*    (2006.01)
*G06F 7/60*    (2006.01)
*G06F 17/10*    (2006.01)
*G06G 7/48*    (2006.01)
*A63B 53/00*    (2006.01)

(52) U.S. Cl. ............ 703/1; 703/2; 703/6; 473/324; 473/325

(58) Field of Classification Search .......... 703/1, 2, 703/6; 473/324–325
See application file for complete search history.

(56) References Cited

U.S. PATENT DOCUMENTS

| | | | |
|---|---|---|---|
| 5,488,692 A * | 1/1996 | Karasick et al. | 345/420 |
| 5,731,817 A * | 3/1998 | Hahs et al. | 345/423 |
| 5,877,970 A * | 3/1999 | Nesbit et al. | 703/1 |
| 6,648,769 B2 * | 11/2003 | Lee et al. | 473/223 |
| 6,876,956 B1 * | 4/2005 | Cirak et al. | 703/2 |
| 6,983,637 B2 * | 1/2006 | Nesbit et al. | 73/12.02 |
| 7,062,082 B2 * | 6/2006 | Miki et al. | 382/154 |
| 7,223,179 B2 * | 5/2007 | Tsunoda | 473/324 |
| 7,241,230 B2 * | 7/2007 | Tsunoda | 473/324 |
| 7,454,948 B2 * | 11/2008 | Tsunoda | 73/9 |
| 7,494,426 B2 * | 2/2009 | Nishio et al. | 473/350 |
| 2004/0162157 A1 * | 8/2004 | Naito et al. | 473/324 |
| 2004/0162158 A1 * | 8/2004 | Tsunoda | 473/324 |

(Continued)

FOREIGN PATENT DOCUMENTS

JP    2005-006763 A    1/2005

(Continued)

OTHER PUBLICATIONS

Souffez et al., "Dual graph of a mesh partition for interactive analysis of huge digital mockups," Computer Aided Design and Computer Graphics, 2005. Ninth International Conference on , vol., No., pp. 6, Dec. 7-10, 2005.*

*Primary Examiner* — Dwin M Craig
*Assistant Examiner* — Aniss Chad
(74) *Attorney, Agent, or Firm* — Sughrue Mion, PLLC

(57) ABSTRACT

The accuracy or computation speed of analysis of a club head using the finite element method is increased. In a method of analysis of a golf club head, a model of a golf club head represented by the collection of elements including polygonal shell elements 30 each having three or four vertexes is prepared on a computer, six or more nodes 32 are provided at the vertexes and on at least one side of the element, and the kinetic properties of the golf club head are computed by the finite element method in which the elements and nodes of the model are used and the nodes are made output points of computation.

7 Claims, 4 Drawing Sheets

U.S. PATENT DOCUMENTS

| | | | |
|---|---|---|---|
| 2006/0160637 A1* | 7/2006 | Matsunaga | 473/324 |
| 2007/0015601 A1 | 1/2007 | Tsunoda et al. | |
| 2009/0240479 A1* | 9/2009 | Matsunaga et al. | 703/2 |
| 2010/0160072 A1* | 6/2010 | Matsunaga et al. | 473/324 |

FOREIGN PATENT DOCUMENTS

| | | |
|---|---|---|
| JP | 2005-065996 A | 3/2005 |
| JP | 2006-023955 A | 1/2006 |
| JP | 2006-031430 A | 2/2006 |

* cited by examiner

D1

D2

D3

D4

METHOD OF ANALYSIS FOR KINETIC PROPERTIES OF GOLF CLUB HEAD AND GOLF CLUB THEREFOR

BACKGROUND OF THE INVENTION

The present invention relates to a method of analysis of the kinetic properties of a golf club head, and relates to a golf club having the golf club head. More particularly, the present invention relates to a method of analysis for simulating properties involving the deformation of a golf club head, a method being carried out by a finite element method using a model reproduced on a computer.

The finite element method has been known as a computation method for analyzing properties of an object with an intricate shape on a computer by dividing the object into a plurality of elements, and by evaluating some physical quantities in each element. The finite element method has an advantage that, when a structural design is made with this method, the user can understand phenomena occurring on the object even if the user does not necessarily have advanced knowledge of material mechanics or elastodynamics. Therefore, the finite element method is used widely to analyze various structures and articles.

In the finite element method, processing is performed to generate the collection of elements beforehand, depending on the phenomenon or physical quantity to be evaluated or on the construction of the object. The mode of this generation of elements is often called "sectioning of mesh", and this is known as a factor that may significantly influence the computation accuracy of the finite element method.

On the other hand, an object having an intricate three-dimensional shape, such as a golf club head (hereinafter referred to as a "club head"), may also be analyzed with the finite element method at the design stage to select the material thereof or to determine the construction thereof for the purpose of appropriately designing a club head in which, for example, resilience performance and hitting sound are balanced (for example, refer to Japanese Patent Application Publication No. 2005-65996).

As one ideal element model to analyze the kinetic properties of an object by using the finite element method, modeling is performed assuming that at least some elements are formed by polygons each having a small thickness. Such a model is especially suitable for the analysis of a hollow club head such as a driver and a wood. In the modeling, the thickness of the actual construction reflected appropriately with respect to the surrounding elements, when computing bending deformation etc. and elements that are triangles or quadrangles (pentahedrons or hexahedrons) having a thickness, or shell elements, are used. To make computations with high accuracy with the shell elements, the polygon of each element surface can be made a regular polygon. However, it is difficult to analyze the kinetic properties of a club head by such regular polygonal shell elements only. The reason for this is that, since the shape of a club head is intricate, difficulties arise in dividing a modeled club head into elements and providing all shell elements contained therein by regular polygons.

SUMMARY OF THE INVENTION

To solve the above problem, it is desired to prepare a club head model in which physical properties that approximate the real club head as closely as possible can be obtained in parts of the club head represented by polygonal elements having a thickness, or shell elements, and the computation accuracy is improved even for an intricate shape prone to having a high aspect ratio, while suppressing significant increase of the computation time.

It has been revealed that a model meeting three conditions described below is desirable for the finite element analysis of club head using shell elements.

Firstly, it is desirable that the largest possible number of elements be formed by quadrangles. If a triangular element is present, each face of such an element has a triangular shape, the approximation with respect to stress on the triangular face is different from that on the quadrangular face of the other elements. Such a difference in the approximation deteriorates the computation accuracy as a whole. It is to be noted that since it is difficult to make all elements quadrangular when a finite number of elements is used, it is sometimes necessary to use triangular elements.

Secondly, it is desirable that the aspect ratio of each element be close to 1:1, that is, the surface shape of each element be close to a regular triangle or a square. The aspect ratio is defined as a ratio of the length of the longest side to the length of the shortest side of all sides of the surface constituting an element. Herein, the term "surface" means a face of an element corresponding to the surface of the club head. For an element having a high aspect ratio, the approximation accuracy in the direction of the long side decreases. Combining the first condition with the second condition, an element having a shape close to that of a square is preferable.

Thirdly, it is desirable that the mesh be made fine, that is, that the number of elements be increased. As the mesh is made finer and more elements are used, the computation accuracy increases. In the conventional art, however, if the model is sectioned into a fine mesh, the number of elements increases, which leads to a problem in that the computation time increases, and in some cases, the computation cannot be performed. Therefore, as the third condition, from the viewpoint of taking account of practicability considering computation time as well, it is necessary to prepare a model capable of achieving both high computation accuracy and high computation speed, that is, a model in which the accuracy is increased without increasing the number of elements.

These conditions are explained in more detail from the viewpoint of problems occurring when they are applied to a club head. The first condition poses a problem typically in the case of a model in which a triangular element is present. Also, in the second condition, since the shape of a club head is intricate, difficulties arise in making all elements of a simulated model quadrangular and in making the elements have a uniform size in the region in which the club head is approximated. Furthermore, the third condition becomes tangible as a problem in that the number of divisions of mesh (that is, the number of elements) cannot be set so that both high computation accuracy and high computation speed are achieved in any of the above-described models.

An object of one aspect of the present invention is to ease designing or refining the design for improving the performance of club heads by achieving both high computation speed and high computation accuracy by partially meeting the above-described conditions and by solving at least one of the problems.

The present invention provides a method of analysis for the kinetic properties of a golf club head, including steps of preparing the model of the golf club head represented by a set of elements on a computer, wherein a surface of each element representing the surface of a golf club head is a polygon having three or four vertexes and sides; providing nodes at the vertexes and on at least one side of the element; and computing the kinetic properties of the golf club head by the finite element method in which the elements and nodes of the model are used and the nodes are set as output points of computation, wherein, in at least some of the elements, the number of nodes provided per one element is not fewer than six. Also, the present invention provides a golf club having a golf club head analyzed or designed by using the above-described method of analysis.

By using the method of analysis in accordance with the present invention, an appropriate model for simulating the club head is obtained, so that the kinetic properties of the club head reproduced as a model can be analyzed appropriately by the finite element method. The computation accuracy at the time when the kinetic properties of the club head are analyzed using the finite element method can thereby be enhanced, or the computation speed can be increased while the same computation accuracy is maintained. As a result, for example, the selection of material or construction for increasing the carry, can be made rapidly. A high-performance club head can thereby be analyzed or designed easily.

DESCRIPTION OF THE PREFERRED EMBODIMENTS

An embodiment of the present invention will now be described with reference to the accompanying drawings. According to the present invention, vibrations occurring when a golf ball is hit by a club head can be studied by means of simulation on a computer, in which simulations of the vibrations are decomposed into a set of natural vibration modes. When the structural design of a club head is carried out to determine the shape and material of the club head, the thicknesses of parts of club head, and the like, the kinetic properties of club head can be predicted without doing an experiment in which measurements are made by actually hitting a golf ball with a club, or omitting the process of such an experiment in the analysis. The physical quantity or physical properties evaluated in the analysis of kinetic properties of the club head cover macroscopic properties of the club head including deformation, dynamic properties of the club head, such as natural frequency, initial speed, delivery angle, and spin, and microscopic properties including strain and stress in each part of the club head. These kinetic properties to be analyzed also include a static behavior in which time dependence is not important, and a dynamic behavior in which time dependence is important. Also, the method of analysis in accordance with the present invention includes batch processing in which a set of parameters is assumed, with which the material and construction conditions for simulating the kinetic properties are changed continuously or sequentially for evaluation, optimization processing in which the optimum values for the parameters are determined, wherein the kinetic properties are evaluated directly or by any evaluation function, and the like processing.

FIG. 1 is a flowchart showing an analysis method 10 in accordance with one aspect of the present invention. When the processing is started, in a preprocessor, preparation such as generation of a club head model to be computed is made (Step 12). The details on what sort of model is generated by what method at this time will be described later. Next, on the generated model, the kinetic properties shown by the model are computed by using a solver for primarily performing matrix computation (Step 14). The computation at this time is made by the finite element method. Then the processing for evaluating the computed kinetic properties and visualizing the computation result is performed by using a postprocessor (Step 16). If the evaluator intends to change, for example, the material of club head or to change the condition such as the construction as a result of evaluation using the postprocessor, accordingly, a refined model may be generated again by the preprocessor, or a refined condition may be set. The refined model may involve a change in parameters of elements due to changes in thicknesses of parts, and the refined condition includes a change in condition such as a change in material. Thus, in the analysis method in accordance with one aspect of the present invention, since the analysis using the finite element method is conducted by the generation of a model, the model being prepared significantly influences the subsequent behavior of the computed club head model, and consequently, it influences the accuracy and speed of the overall computation. Next, the features of the finite element method model of club head used in the analysis method in accordance with the present invention will be described.

The model on a computer is represented and defined by data sequences recorded on any recording medium, the data sequences themselves being capable of being read by the computer. The computation of the finite element method is made by using this sequence of data representing the model, and the simulation is carried out with respect to the kinetic properties of club head to be analyzed. The sequence of data defining the model includes, of all data necessary for the computation, at least node position data capable of defining each element, and any form of data relating to the connection from which the connection among nodes can be reproduced. The sequence of data optionally includes data relating to material wherein the data embodies the material properties of each element, and, in some cases, includes other supplementary data. The elements and the nodes are defined by three-dimensional spatial arrangement thereof in addition to the above-described data. The model used in the analysis method in accordance with the present invention will be described below by way of an example of such three-dimensional arrangement of elements and nodes.

FIG. 2 is an explanatory view showing the arrangement of nodes 32 in each element 30 of a model used in an embodiment of the present invention. As the element, a shell element having a quadrangular shape is arranged. This shell element is an element with a shell shape having a quadrangular surface constituting the surface of the club head and having a thickness. As shown in FIG. 2, each of the quadrangular elements is provided with eight nodes 32. According to conventional art, in a case in which a quadrangular element is used, nodes can be arranged only at four vertexes of the quadrangular element. In contrast, in the embodiment of the present invention, nodes are arranged at the midpoints of sides in addition to these vertexes, whereby eight nodes 32 are used in total. In addition, a triangular element may also be used as necessary.

On the surface of the shell element shown in FIG. 2, there exist four vertexes A to D. The arrangement of nodes is will be described in detail. A quadrangle ABCD is surrounded by sides (edges) AB, BC, CD and DA. On these sides, midpoints $M_{AB}$, $M_{BC}$, $M_{CD}$ and $M_{DA}$ exist. The nodes are provided not only at the four vertexes A to D, but also at the midpoints $M_{AB}$, $M_{BC}$, $M_{CD}$ and $M_{DA}$.

Generally, in the present invention, a quadrangle is not necessarily limited to a mathematical quadrangle, or a plane figure surrounded by four line segments. The quadrangle described in the present application includes a figure, in which four vertexes are not necessarily included in a literally complete plane, four line segments surrounding the figure may be deformed so that one vertex of the four vertexes deviates from the plane formed by other three vertexes. This deformation from the plane may be a deformation produced as a result of the deformation simulated by computation, or may be a deformation from the plane that has been present from the initial stage at which the element is generated. In the actual element, this deformation is minute in almost all cases. Also, the side constituting the quadrangle or the triangle may be a straight line or may be a curved line.

The angle between the adjacent sides in each shell element is preferably 30 to 150 degrees, and more preferably 35 to 145 degrees.

Also, the aspect ratio used in the present invention is determined for an element at the stage at which the mesh or elements have been prepared. In this regard, the aspect ratio of an element is defined as a value obtained by dividing the length of the longest side by the length of the shortest side of all sides of the surface of that element. Applying this definition to the element 30 shown in FIG. 2, the aspect ratio is calculated by dividing the length of the longest side of the sides AB, BC, CD and DA by the length of the shortest side thereof.

Generation of Mesh

The shell element used herein can be computed by using a relatively small number of nodes, and the material that is not deformed significantly and has a predetermined thickness can be simulated with high computation accuracy. In contrast, under conditions in which elasticity and viscosity are considered in the material of the club head, sufficiently high computation accuracy can be obtained even by the computation of solid elements, not of shell elements. Examples of such a condition include a condition in which time change is negligible, and a club having less hollow part, such as an iron club. In the shell element, since the amount of computation can be minimized as compared with the case in which the solid element is used, the computation with shell elements has a feature of having a relatively high computation speed. Especially in the present application, it is preferable that a hollow golf club head having a club head volume of 250 to 480 cm$^3$ be used, and both of the shell element and the solid element can be used depending on the material and size of each part.

As described above, the model is prepared by using the preprocessor (FIG. 1, Step 12). The specific means for preparing such a model will be described in more detail. In the embodiment of the present invention, as one example, after a shape for obtaining each element has been defined by using 3D-CAD, the preprocessor is used. Specifically, in the case of this example, first, the geometries for a shape representing a club head and for a region of each element in each mesh are defined by using 3D-CAD. Thereafter, a mesh is generated from the geometries by using the preprocessor.

Provision of Nodes

Next, the nodes are provided at the vertexes and at the midpoints between the adjacent two vertexes. The adjacent two vertexes are adjacent two vertexes belonging to a common edge. That is, whether the two vertexes are adjacent or not is not judged by the distance between the two vertexes. The data of conditions for specifying the node may be obtained by receiving the user's selection. Therefore, at the stage in which the model is sectioned into a mesh by the preprocessor, the condition can be defined so that the eight nodes in each element are set automatically.

Provision of Material Parameter

Then, material parameters are given to each element. Depending on the nature of the club head to be simulated, parameters (physical property data) necessary for simulation, such as a parameter for specifying elasticity and viscosity (collectively, referred to as physical properties), are given to each element. In the in which where the objective of simulation is to determine changes in kinetic properties due to the material by changing the material only in the simulation, while maintaining the dimensions of a crown, sole, face, and the like, the generation of a mesh and the provision of nodes are accomplished in advance, and the operation can be performed so that only the material parameters are selected successively in ranges of predetermined values. By the above-described processing, in the present invention, the solver (Step 14) can generate data for the use in computation.

Embodiment 1

In one embodiment of the present invention, if the aspect ratio of element is not lower than 1.0 and not higher than about 10.0 in all elements, a satisfactory analysis can be made. Also, if the aspect ratio of element is preferably not lower than 1.0 and not higher than about 9.0 in all elements, a satisfactory analysis can be made. Further, the aspect ratio thereof is preferably not lower than 1.0 and not higher than about 8.0.

Embodiment 2

Also, in another embodiment of the present invention, the angle between the adjacent sides in the polygon of the surface of shell element is preferably 30 to 150 degrees, further preferably 35 to 145 degrees. In this configuration, the distance between the nodes can be kept uniform, so that the computation accuracy can be improved.

Embodiment 3

In yet another embodiment of the present invention, the number of nodes in the model indicates the number of output points of the finite element method. Therefore, in this embodiment, the number of output points increases, which achieves improved computation accuracy. To verify this, simulation was performed by making the number of nodes provided in one shell element three or six for the triangular shell element, and four or eight for the quadrangular shell elements, and the analysis results obtained therefrom, were compared. As a result, in the case in which the number of nodes was made three for the triangular shell element or the number of nodes was made four for the quadrangular shell element, a sufficient computation accuracy was not obtained. In contrast, in the case in which the nodes were provided at the midpoints of sides, and the number of nodes was made six for the triangular shell element or the number of nodes was made eight for the quadrangular shell element, analysis was made with satisfactory computation accuracy.

Computation Example

As a computation example concerning the above-described embodiments of the present invention, computation was made by applying a mesh generating method having the features described in the above embodiments 1 to 3 to simulate some club head samples. In this computation example, the first-order natural frequency obtained by the vibration mode analysis is computed, and the computation result is compared with the corresponding the natural frequency of the real club head.

Any of models D1 to D4 has a shape defined in a computer to specify the shape of club head and the thickness d of each part so as to reflect the shape of the real club head. In the models D1 to D4, each part of a crown, sole, face, and the like is divided into a plurality of regions as necessary. The divided regions are shown in top plan views (upper figures) and front views (lower figures) of wire frame views of FIG. 4. FIGS. 4(1) to 4(4) show the models D1 to D4, respectively. In the regions in the models D2 to D4, the thicknesses of thick line portions in FIGS. 4(2) to 4(4) are increased from the thickness of the model D1 shown in FIG. 4(1). The models D1 to D4 each have a thickness d (unit: mm) as indicated by the numerical values shown in the bottom plan views of FIGS. 3(1) to 3(4). The thicknesses given to the regions of the models D1 to D4 are collectively shown in Table 1 including the thicknesses of parts not illustrated. In Table 1, the name on each row may indicate a different part for each model. For example, a part in which "sole thickness 1" denotes in the model D2 is different from a part in which "sole thickness 1" denotes in the model D3, as is apparent from the comparison of FIG. 4(2) with FIG. 4(3).

TABLE 1

|  | Model D1 | Model D2 | Model D3 | Model D4 |
|---|---|---|---|---|
| Head weight (g) | 174.7 | 190 | 190.3 | 189.8 |
| Volume (cm³) | 451.0 | 451.0 | 451.0 | 451.0 |
| Sole thickness 1 (mm) | 0.8 | 0.8 | 0.8 | 0.8 |
| Sole thickness 2 (mm) | 0.8 | *1.3* | *1.2* | 0.8 |
| Crown thickness (mm) | 0.7 | 0.7 | 0.7 | 0.7 |
| Side thickness 1 (mm) | 1.0 | 1.0 | 1.0 | 1.0 |
| Side thickness 2 (mm) | 1.0 | *1.3* | *1.2* | *3.9* |

In Table 1, numerical values changed from those of the model D1, which is the standard, are indicated by italics.

Next, we will describe a mesh generating method, wherein the mesh generating method is carried out prior to analyzing the models D1 to D4 prepared as described above based on the finite element method. In the computation example shown here, an example in which nodes are provided at the vertexes and midpoints of a quadrangular shell element, comparative example 1 in which the number of elements is the same as that of the example, but nodes are provided at the vertexes only, and comparative example 2 in which the number of elements is increased, instead of providing nodes only at the vertexes, are described. By applying the example, comparative example 1, and comparative example 2 to the above-described models, for club heads having different conditions, computation accuracy can be compared, in terms of the natural frequency, an example to which embodiment 3 is applied from examples adopting other meshes. The number of elements and the number of nodes generated in the example, comparative example 1, and comparative example 2 are given in Table 2.

TABLE 2

|  | Example | Comparative example 1 | Comparative example 2 |
|---|---|---|---|
| Number of elements | 2609 | 2609 | 9410 |
| Number of nodes | 5218 | 2609 | 9419 |
| Max. aspect ratio | 5.5 | 5.5 | 10.3 |
| Min. element angle | 36.1 | 36.1 | 38.2 |
| Max. element angle | 144 | 144 | 147.7 |

That is, as compared with comparative example 1, the example has the same number of elements, and has double the number of nodes. Also, as compared with comparative example 2, the example has a number of elements of about 1/3.6, and has a number of nodes of about 1/1.8. Table 2 also gives the values of the maximum aspect ratios, and the maximum and minimum values of the internal angles of polygons on the surfaces of all elements in all elements of the example, comparative example 1, and comparative example 2. Generally, it is known that the internal angle of the shell element is in the range of 10 to 170 degrees, and the accuracy may probably decrease unless the internal angle of the shell element is in the range of 30 to 150 degrees. In the example, since the internal angle of the shell element is in the range of 30 to 150 degrees, computation with high accuracy can be anticipated.

Furthermore, FIGS. 5 to 7 show meshes generated by the above-described method. FIGS. 5 to 7 correspond to the example, comparative example 1, and comparative example 2, respectively. The example and comparative example 1 are different from one another only in the number of nodes (not shown), and are completely the same in the sectioning into elements. By comparing the example and comparative example 2, the number of elements differs significantly, and further the number of nodes differs significantly. In comparative example 2, a large number of elements is generated by a mesh generation algorithm that is the same as that of comparative example 1, but a parameter specified to generate a mesh is changed to make the number of generated elements different. As described above, in comparative examples 1 and 2, nodes are provided only at the vertexes of each element, and are not provided at midpoints of edges.

As described above, the models D1 to D4 each having three kinds of meshes and nodes were prepared, and the computation of the finite element method was made under a total of twelve computation conditions to analyze vibration mode. The computation result of a natural frequency (first-order natural frequency) determined in the vibration mode analysis was compared with the actually measured value of a natural frequency of the real club head prepared so as to match the model. The comparison results are given in Table 3.

TABLE 3

|  | First-order natural frequency (Hz) | | | |
|---|---|---|---|---|
|  | Measured value | Example | Comparative example 1 | Comparative example 2 |
| Model D1 | 2990 | 2950 | 2940 | 2920 |
| Model D2 | 3290 | 3230 | 3190 | 3160 |
| Model D3 | 3130 | 3080 | 3040 | 3030 |
| Model D4 | 3320 | 3060 | 3040 | 3020 |

As seen from Table 3, in the example, computation values of natural frequencies close to the actually measured value are obtained as compared with comparative example 1. Also, in comparative example 2, the computation value deviates from the actually measured value as compared with comparative example 1.

Since, four nodes are provided on each shell element, it has been predicted that, in comparative example 2 in which the number of elements and the number of nodes are larger than those of comparative example 1, the computation accuracy is higher than that of comparative example 1, and a value close to the actually measured value should be obtained. However, as the result of actual computation, comparative example 1 rather showed a value close to the actually measured value as compared with comparative example 2. The reason for this is supposed to be that, in the computation of comparative example 2, the computation accuracy is deteriorated because of a shortage of computer memory, i.e., too large a matrix, and thereby computation could not be made with sufficient accuracy.

Apart from the above-described problem of memory capacity or computation accuracy, the time required to complete the computation is given in Table 4 as a measure of computation amount.

TABLE 4

| | Computation time (sec) | | |
|---|---|---|---|
| | Example | Comparative example 1 | Comparative example 2 |
| Model D1 | 3 | 3 | 26 |
| Model D2 | 4 | 4 | 28 |
| Model D3 | 4 | 4 | 36 |
| Model D4 | 4 | 4 | 31 |

As seen from Table 4, there is no substantial difference in computation time between the example and comparative example 1. In contrast, in comparative example 2, the computation time increases extremely. Thus, even if it is attempted to secure computation accuracy by increasing the number of elements, the computation accuracy is not necessarily improved, and rather, the computation load is increased in some cases. In contrast, according to the embodiment of the present invention, the computation accuracy can be improved while the practical speed or computation load is maintained. To obtain the above results, for all computation conditions, a factor obtained empirically was used to convert the computation value into the actually measured value, and the factor is identical for all computation conditions. Also, in the element of each model, a thickness was set to that of the region to which the element belongs, and parameters such as Poisson's ratio and Young's modulus had the values of actual materials.

It is found that, as shown in this computation example, even if the number of elements is increased unreasonably, high accuracy is not always the result, and rather, sufficient computation accuracy and computation speed can be achieved by increasing the number of nodes without changing the number of elements.

The above is a description of the embodiment of the present invention. The present invention is not limited to the above-described embodiment or example, and various modifications, changes, and combinations can be made based on the technical concept of the present invention.

Figure 1:
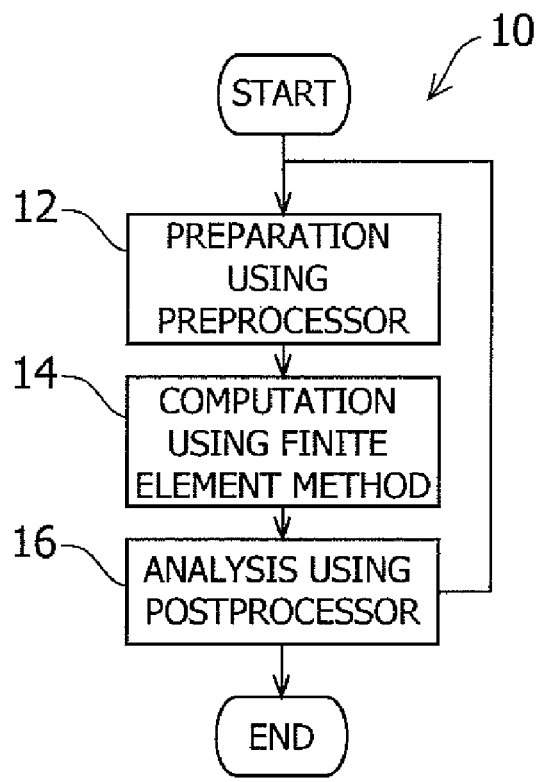
FIG. 1 is a flowchart showing a processing process of a method of analysis in accordance with the present invention.
Figure 2:
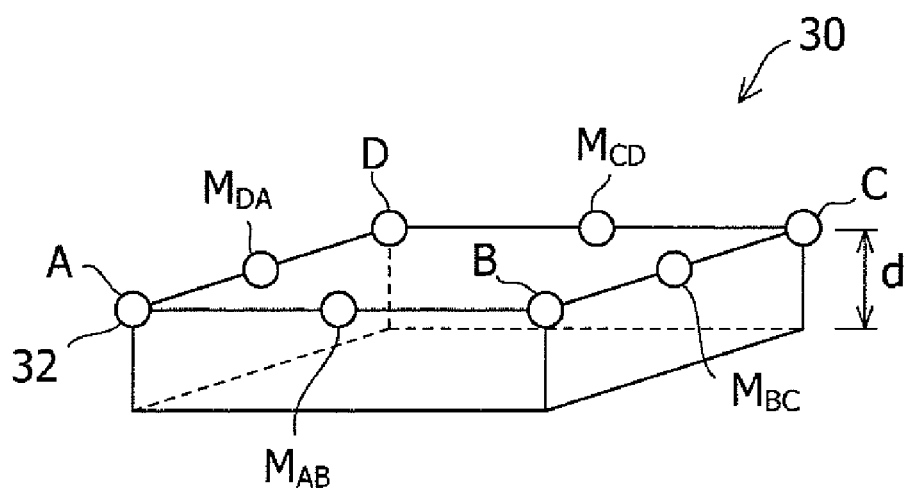
FIG. 2 is an explanatory view showing an example of a shell element used in a mode of the present invention.
Figure 3:
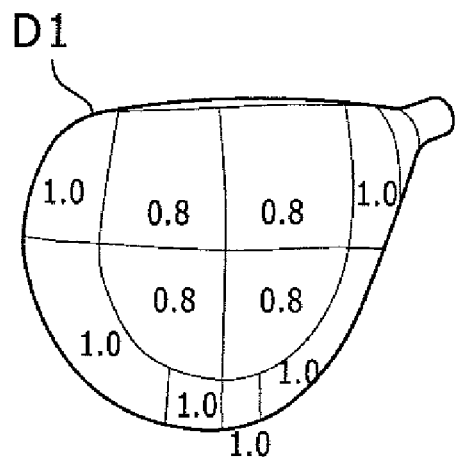
FIGS. 3(1) to 3(4) are bottom plan views of models D1 to D4, respectively, used in an example of computation for analyzing a club head of the present invention, in which numeral values in the figures denote the thicknesses (mm) of parts.
Figure 3:
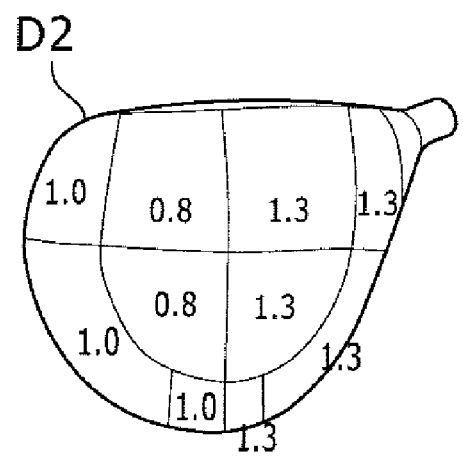
Figure 3:
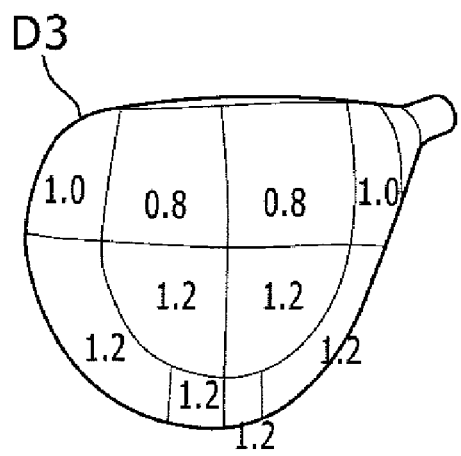
Figure 3:
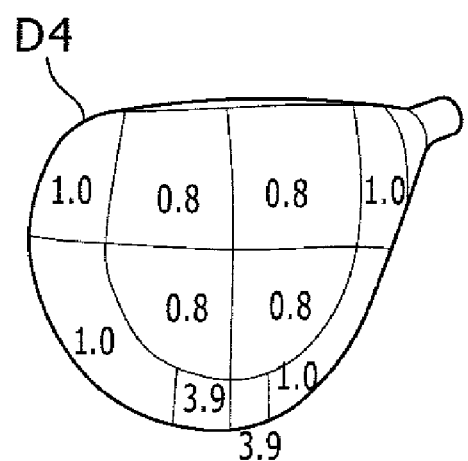
Figure 4:
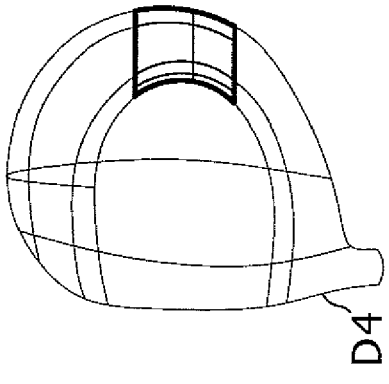
FIGS. 4(1) to 4(4) are wire frame views showing models D1 to D4, respectively, used in an example of computation for analyzing a club head of the present invention, the upper figures being top plan views, and the lower figures being front views, in which thick lines indicate portions having increased thickness.
Figure 4:
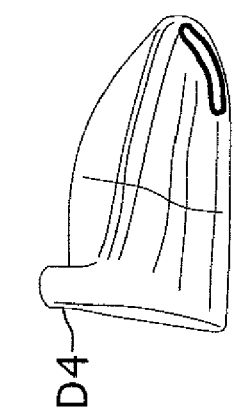
Figure 4:
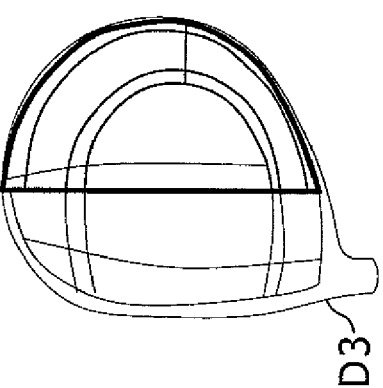
Figure 4:
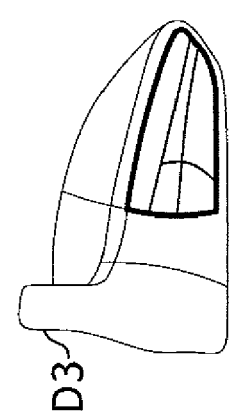
Figure 4:
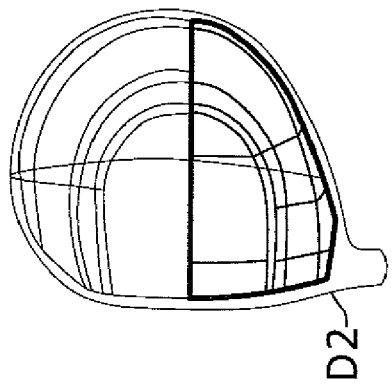
Figure 4:
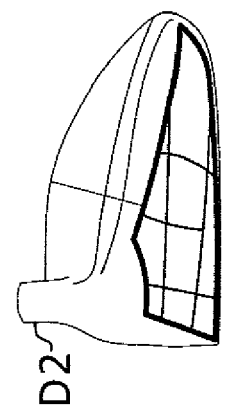
Figure 4:
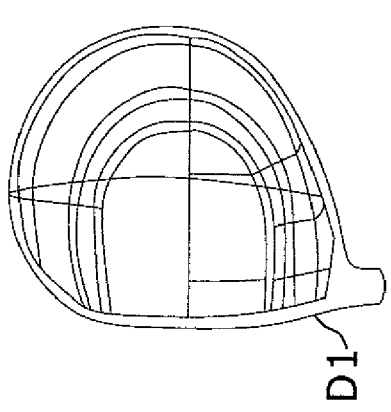
Figure 4:
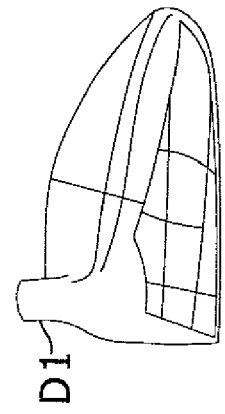
Figure 5:
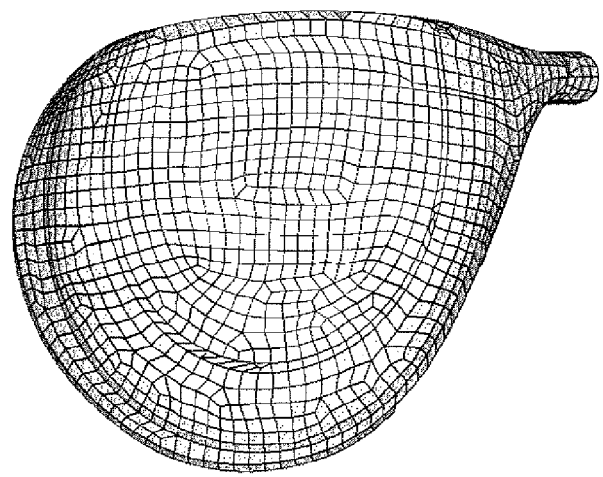
FIG. 5 is an explanatory view showing an example used in a computational example for analyzing a club head of the present invention.
Figure 6:
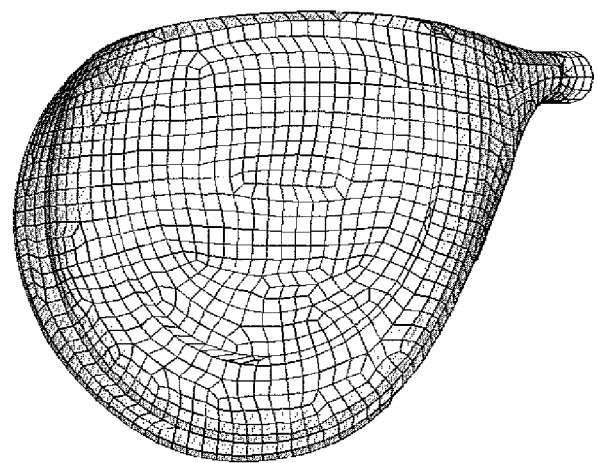
FIG. 6 is an explanatory view showing comparative example 1 used in a computational example for analyzing a club head of the present invention.
Figure 7:
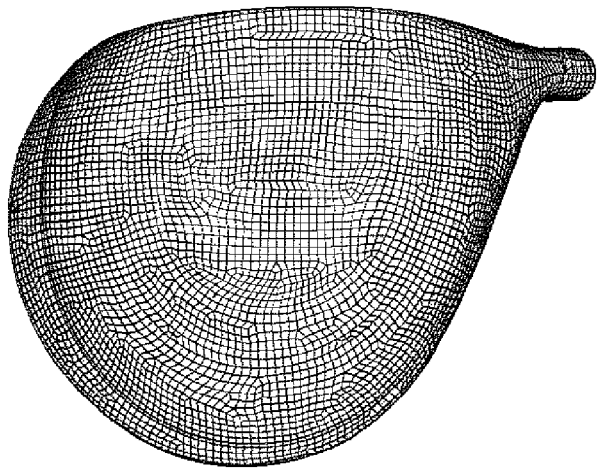
FIG. 7 is an explanatory view showing comparative example 2 used in a computational example for analyzing a club head of the present invention.

| Reference Numerals |
|---|
| 10 Method of Analysis |
| 30 Shell Elements |
| 32 Nodes |

What is claimed is:

1. A method of analysis of the kinetic properties of a golf club head, comprising the steps of:
    preparing a model of a golf club head represented by a set of elements on a computer, wherein a surface of each element representing the surface of golf club head is a polygon having three or four vertexes and sides;
    providing nodes at the vertexes and on at least one side of the element between adjacent ones of the vertexes; and
    computing the kinetic properties of the golf club head by the finite element method in which the elements and nodes of the model are used and the nodes are set as output points of computation,
    wherein, in at least some of the elements, the number of nodes provided per one element is not fewer than six.

2. The method of analysis according to claim 1, wherein an aspect ratio of surface shape of the element is not less than 1.0 and not more than 10.0.

3. The method of analysis according to claim 1, wherein at least some of the elements are shell elements, and the node provided on the side is placed at the midpoint of the side.

4. The method of analysis according to claim 1, wherein in all of the elements contained in the model, the aspect ratio of surface shape of the element is not less than 1.0 and not more than 9.0.

5. The method of analysis according to claim 1, wherein the angle between the adjacent sides of the polygon is not less than 30 degrees and not more than 150 degrees.

6. The method of analysis according to claim 1, wherein the club head has a hollow construction.

7. A golf club having a golf club head analyzed or designed by using the method of analysis according to claim 1.

* * * * *